(12) United States Patent
Marko

(10) Patent No.: US 8,667,344 B2
(45) Date of Patent: Mar. 4, 2014

(54) METHOD AND APPARATUS FOR CONCATENATED CONVOLUTIONAL ENCODING AND INTERLEAVING

(75) Inventor: Paul D. Marko, Pembroke Pines, FL (US)

(73) Assignee: Sirius XM Radio Inc., New York, NY (US)

( * ) Notice: Subject to any disclaimer, the term of this patent is extended or adjusted under 35 U.S.C. 154(b) by 0 days.

(21) Appl. No.: 13/618,906

(22) Filed: Sep. 14, 2012

(65) Prior Publication Data

US 2013/0073929 A1 Mar. 21, 2013

Related U.S. Application Data

(63) Continuation of application No. 12/643,336, filed on Dec. 21, 2009, now Pat. No. 8,290,000, which is a continuation of application No. 11/390,499, filed on Mar. 28, 2006, now Pat. No. 7,653,088, which is a continuation of application No. 09/849,237, filed on May 7, 2001, now Pat. No. 7,058,086, which is a continuation-in-part of application No. 09/433,861, filed on Nov. 4, 1999, now Pat. No. 6,229,824, and a continuation-in-part of application No. 09/688,824, filed on Oct. 17, 2000, now Pat. No. 6,614,767, which is a continuation of application No. 09/318,938, filed on May 26, 1999, now Pat. No. 6,154,452.

(51) Int. Cl.
*G06F 11/00* (2006.01)

(52) U.S. Cl.
USPC ............ 714/704; 714/790; 370/321; 370/477

(58) Field of Classification Search
USPC .......................... 714/704, 790; 370/321, 477
See application file for complete search history.

(56) References Cited

U.S. PATENT DOCUMENTS 4,429,390 A 1/1984 Sonoda et al.
4,622,598 A 11/1986 Doi et al.
(Continued)

FOREIGN PATENT DOCUMENTS

EP 0930738 7/1999
EP 1014590 6/2000
(Continued)

OTHER PUBLICATIONS

Kroeger et al., "Robust modem and coating techniques for FM Hybrid IBOC DAB," IEEE Transactions on Broadcasting, vol. 43, No. 4, Dec. 1997, pp. 412-420.

(Continued)

*Primary Examiner* — Sam Rizk
(74) *Attorney, Agent, or Firm* — Roylance, Abrams, Berdo & Goodman, LLP

(57) ABSTRACT

A method and apparatus encode a source data stream via convolutional encoding or selected encoding scheme. Plural encoded data streams are interleaved and transmitted on a transmission channel. Data groups generated via convolutional or selected encoding are interleaved via time-interleaving functions to disperse selected bits within data groups, bits in between data groups, and bits in selected sets of data groups to facilitate reconstruction of the source data stream from at least a portion of the interleaved data stream received on at least one transmission channel. Subsets of bits of data groups are selected to allow reconstruction of the source data stream from more than one of plural transmission channels using a minimum number of subsets. Multiple combinations of subsets can be received on both transmission channels to reconstruct the source data stream following blockage of one channel.

9 Claims, 6 Drawing Sheets

(56) References Cited

U.S. PATENT DOCUMENTS

| | | |
|---|---|---|
| 4,797,589 A | 1/1989 | Collins |
| 4,881,241 A | 11/1989 | Pommier et al. |
| 5,191,576 A | 3/1993 | Prommier et al. |
| 5,197,061 A | 3/1993 | Halbert-Lassalle et al. |
| 5,228,025 A | 7/1993 | Le Floch et al. |
| 5,241,563 A | 8/1993 | Paik et al. |
| 5,278,863 A | 1/1994 | Briskman |
| 5,283,780 A | 2/1994 | Schuchman et al. |
| 5,305,353 A | 4/1994 | Weerackody |
| 5,319,673 A | 6/1994 | Briskman |
| 5,485,485 A | 1/1996 | Briskman et al. |
| 5,691,995 A | 11/1997 | Ikeda et al. |
| 5,720,039 A | 2/1998 | Lieberman |
| 5,745,497 A | 4/1998 | Ben-Efraim et al. |
| 5,745,839 A | 4/1998 | Lieberman |
| 5,794,138 A | 8/1998 | Briskman |
| 5,812,601 A | 9/1998 | Schramm |
| 5,848,103 A | 12/1998 | Weerackody |
| 5,864,579 A | 1/1999 | Briskman |
| 5,883,899 A | 3/1999 | Dahlman et al. |
| 5,907,582 A | 5/1999 | Yi |
| 5,909,434 A | 6/1999 | Odenwalder et al. |
| 5,910,967 A | 6/1999 | Vanderaar |
| 5,937,016 A | 8/1999 | Choi |
| 6,016,568 A | 1/2000 | Wolf et al. |
| 6,061,387 A | 5/2000 | Yi |
| 6,084,865 A | 7/2000 | Dent |
| 6,108,810 A | 8/2000 | Kroeger et al. |
| 6,154,452 A | 11/2000 | Marko et al. |
| 6,158,041 A | 12/2000 | Raleigh et al. |
| 6,178,317 B1 | 1/2001 | Kroeger et al. |
| 6,202,189 B1 | 3/2001 | Hinedi et al. |
| 6,229,824 B1 | 5/2001 | Marko |
| 6,247,158 B1 | 6/2001 | Smallcomb |
| 6,259,893 B1 | 7/2001 | Kroeger et al. |
| 6,317,470 B1 | 11/2001 | Kroeger et al. |
| 6,345,377 B1 | 2/2002 | Kroeger et al. |
| 6,347,122 B1 | 2/2002 | Chen et al. |
| 6,363,058 B1 | 3/2002 | Roobol et al. |
| 6,560,748 B2 | 5/2003 | Li |
| 6,567,475 B1 | 5/2003 | Dent et al. |
| 6,574,247 B1 | 6/2003 | Baggen et al. |
| 6,771,705 B2 | 8/2004 | Kenney et al. |
| 6,944,233 B2 | 9/2005 | Zhang et al. |
| 6,947,487 B2 | 9/2005 | Choi et al. |
| 7,058,027 B1 | 6/2006 | Alessi et al. |
| 7,058,086 B2 | 6/2006 | Marko |
| 2001/0055271 A1 | 12/2001 | Okada et al. |
| 2002/0157058 A1 | 10/2002 | Ariel et al. |
| 2004/0005012 A1 | 1/2004 | Suzuki et al. |

FOREIGN PATENT DOCUMENTS

| | | |
|---|---|---|
| WO | 0033559 | 6/2000 |
| WO | 0036783 | 6/2000 |
| WO | 0129986 | 4/2001 |

OTHER PUBLICATIONS

D. Kail, "Direct Radio Broadcasting by Satellite (DRBS): A Review of the Technical Factors and System Approaches Suitable for Mobile and Fixed Reception", The British Broadcasting Corporation, pp. 1-22, (1989).

Samir Kallel, "Complementary Punctured Convolution (CPC) Codes and Their Applications", IEEE, vol. 43, No. 6, Jun. 1995.

J. Bibb Cain, "Punctured Convolutional Codes of Rate (n-1)/n and Simplified Maximum Likelihood Decoding", IEEE Transactions on Information Theory, vol. IT-25, No. 1, Jan. 1979, pp. 97-100.

"Mobile Radio Communications", Second Edition, Edited by Raymond Steele and Lajos Hanzo, Copyright 1999 John Wiley & Sons Ltd, ISBN 0 471 97806 X, pp. 467-470.

Aik Chindapol and James A. Ritcey, "Bit-Interleaved Coded Modulation with Signal Space Diversity in Rayleigh Fading", IEEE, pp. 1003-1007, 1999.

National Academy of Sciences, "The Evolution of Untethered Communications", National Academy Press, USA, 1997, p. 68.

R.C.V Macario, "Modern Personal Radio Systems", IEE Telecommunications Series 33, The Institution of Electrical Engineers, United Kingdom, 1996, p. 260.

John G. Proakis, "Digital Communications", McGraw-Hill International Editions, Singapore, Electrical Engineering Series, Third Edition, 1995, pp. 468-469.

METHOD AND APPARATUS FOR CONCATENATED CONVOLUTIONAL ENCODING AND INTERLEAVING

This application is a continuation of U.S. patent application Ser. No. 12/643,336, filed Dec. 21, 2009 now U.S. Pat. No. 8,290,000, which is a continuation of U.S. patent application Ser. No. 11/390,499, filed Mar. 28, 2006 (issued as U.S. Pat. No. 7,653,088), which is a continuation of U.S. patent application Ser. No. 09/849,237, filed May 7, 2001 (issued as U.S. Pat. No. 7,058,086), which is a continuation-in-part of U.S. patent application Ser. No. 09/433,861, filed Nov. 4, 1999 (issued as U.S. Pat. No. 6,229,824), and a continuation-in-part of U.S. patent application Ser. No. 09/688,824, filed Oct. 17, 2000 (issued as U.S. Pat. No. 6,614,767), which is a continuation of U.S. patent application Ser. No. 09/318,938, filed May 26, 1999 (issued as U.S. Pat. No. 6,154,452); the entire contents of each of these applications is incorporated herein by reference.

FIELD OF THE INVENTION

The invention relates to a method and apparatus for concatenated convolutional encoding and interleaving of a source data stream for transmission.

BACKGROUND OF THE INVENTION

Radio frequency transmissions are often subjected to multipath fading. Signal blockages at receivers can occur due to physical obstructions between a transmitter and the receiver or service outages. For example, mobile receivers encounter physical obstructions when they pass through tunnels or travel near buildings or trees that impede line of sight (LOS) signal reception. Service outages can occur, on the other hand, when noise or cancellations of multipath signal reflections are sufficiently high with respect to the desired signal.

Communication systems can incorporate two or more transmission channels for transmitting the same program or data to mitigate the undesirable effects of fading or multipath. For example, a time diversity communication system delays the transmission of program material on one transmission channel by a selected time interval with respect to the transmission of the same program material on a second transmission channel. The duration of the time interval is determined by the duration of the service outage to be avoided. The non-delayed channel is delayed at the receiver so that the two channels can be combined, or the program material in the two channels selected, via receiver circuitry. One such time diversity system is a digital broadcast system (DBS) employing two satellite transmission channels.

Interleaving of data symbols on the transmission channels of a time diversity system can be employed to mitigate, in particular, the effects of a slow deep fade. An interleaver rearranges a set of consecutive coded data symbols in a data stream to be transmitted such that symbols in the set extend for a duration of time greater than the duration of a slow deep fade. A receiver having a de-interleaver rearranges received symbols to their original order. The interleaved data symbols that are being de-interleaved, however, are subject to independent fades that may not be mitigated by the interleaver due to size constraints of the interleaver.

In addition, a DBS generally has a requirement for protection against an outage of selected minimum duration when both satellite channels are available. Thus, a need exists for a communication system which provides such outage protection. In addition, a need exists for a communication system which provides maximum outage protection within reasonable memory and delay constraints of the interleaver when only a single satellite channel is available.

SUMMARY OF THE INVENTION

The above-described disadvantages are overcome and a number of advantages are realized with the method and apparatus provided by the present invention for encoding a source data stream via convolutional encoding. One or more encoded data streams are interleaved and transmitted on one or more transmission channels. Data groups generated via convolutional encoding are interleaved in accordance with a plurality of time-interleaving functions to disperse selected bits within puncture groups of the data groups, to disperse bits in between data groups, as well as to disperse bits in selected sets of data groups, and thereby facilitate reconstruction of the source data stream from at least a portion of the interleaved data stream received on at least one transmission channel.

In accordance with another aspect of the present invention, two or more transmission channels are employed. The time-interleaving functions are selected to facilitate reconstruction of the source data stream from at least a portion of the interleaved data stream received on at least one of the transmission channels following a continuous blockage of the transmission channels.

In accordance with yet another aspect of the present invention, a single transmission channel is employed. The time-interleaving functions are selected to facilitate reconstruction of the source data stream from at least a portion of the interleaved data stream received on the transmission channel following a continuous blockage of the transmission channel.

In accordance with still yet another aspect of the present invention, each of the puncture groups comprises subsets of bits in the data groups. The subsets of bits are selected such that only a minimum number of the subsets are required to reconstruct the source data stream from more than one of the transmission channels.

In accordance with another aspect of the present invention, the subsets of bits are selected such that multiple combinations of the subsets can be received on both of the interleaved transmission channels and allow reconstruction of the source data stream therefrom following blockage of one of the transmission channels.

In accordance with another aspect of the present invention, decoding at the receiver is performed using convolutional decoding. Decoding is preferably performed using a Viterbi decoder.

In accordance with another aspect of the present invention, the time-interleaving functions are selected to optimize error correction during Viterbi decoding.

In accordance with another aspect of the present invention, the encoded signals are interleaved and then demultiplexed for transmission on plural channels.

In accordance with another aspect of the present invention, the encoded signals are demultiplexed and then interleaved prior to transmission.

In accordance with an embodiment of the present invention, a method of interleaving a source data stream for transmission is provided comprising the steps of: (1) encoding a source data stream to generate an output data stream using a convolutional coding scheme having a selected code rate, the output data stream being characterized as a series of data groups, each of the data groups comprising a plurality of punctured data groups, each of the punctured data groups having a higher code rate with respect to the selected code rate; (2) interleaving the data groups in accordance with a plurality of time-interleaving functions to disperse the bits in the data groups within the output data stream and generate an interleaved data stream; and (3) transmitting the interleaved data stream for transmission via at least one transmission channel, the time-interleaving functions being selected to disperse different groups of bits in the output data stream selected from the group consisting of bits in one of the punctured data groups, bits in adjacent data groups, and bits in selected sets of data groups to facilitate reconstruction of the source data stream from at least a portion of the interleaved data stream received on at least one of the transmission channels.

The time-interleaving functions are selected in accordance with the present invention to facilitate reconstruction of the source data stream from at least a portion of the interleaved data stream. The punctured data groups each comprise subsets of bits in the data groups. The subsets of bits are selected in accordance with the present invention such that only a minimum number of the subsets are required to reconstruct the source data stream from the transmission channel. The subsets of bits are also selected such that multiple combinations of the subsets can be received on at least two interleaved transmission channels and allow reconstruction of the source data stream therefrom following blockage of one of the transmission channels.

The interleaved data stream is decoded using the selected code rate in accordance with the present invention. Decoding is preferably performed using convolutional decoding such as via a Viterbi decoder. The time-interleaving functions are selected in accordance with the present invention to optimize error correction during Viterbi decoding.

BRIEF DESCRIPTION OF THE DRAWINGS

The various aspects, advantages and novel features of the present invention will be more readily comprehended from the following detailed description when read in conjunction with the appended drawings, in which.

Throughout the drawing figures, like reference numerals will be understood to refer to like parts and components.

DETAILED DESCRIPTION OF THE EXEMPLARY EMBODIMENTS

Figure 1:
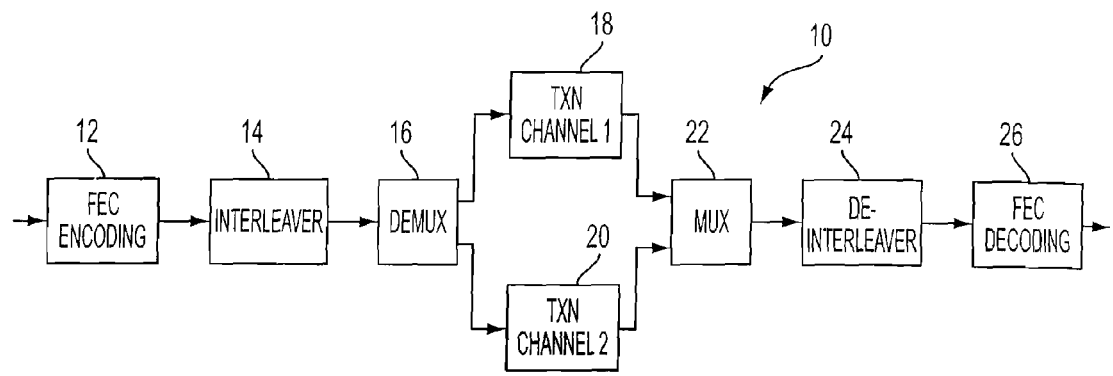
FIG. 1. is a block diagram of a communication system using interleaving in accordance with an embodiment of the present invention.

FIG. 1 depicts a communication system 10 which employs diversity combining. Accordingly, a plurality of transmission channels are used to transmit the same source data or program material. In the illustrated example, two transmission channels are used. The method and apparatus of the present invention will be described for illustrated purposes in connection with a DBS employing two satellites in accordance with an embodiment of present invention. A receiver on a fixed or mobile platform receives two or more signals transmitted via different channels and selects the strongest of the signals or combines the signals. The signals can be transmitted at the same radio frequency using modulation resistant to multipath interference, or at different radio frequencies with or without modulation resistant to multipath. In either case, attenuation due to physical obstructions is minimized because the obstructions are seldom in the LOS of both satellites. It is to be understood, however, that more than two transmission channels can be used and that the transmission channels can be any type of wireline or wireless data communication path.

With continued reference to FIG. 1, a source data stream is encoded using a forward error correction (FEC) algorithm with a selected code rate, as indicated at 12, to allow the loss of a percentage of channel bits during transmission while maintaining an error free output. The output of the FEC encoder 12 are interleaved via an interleaver 14 to randomize the bit order and to de-correlate bit errors caused by blockage and multipath propagation. The interleaving of the present invention, which is described below in connection with FIGS. 6 and 7, allows for a continuous blockage of a selected duration (e.g., approximately 4 seconds) when both transmission channels are available. In addition, the encoded data stream is punctured to create puncture groups for respective transmission channels. The puncture groups are selected such that only a minimum number of subsets of bits in the punctured data groups are required to reconstruct the source data stream from more than one of the transmission channels. In addition, the puncture groups are selected such the multiple combinations of subsets can be received on both of the transmission channels and allow reconstruction of the source data stream following blockage of one of the transmission channels. The puncture groups, the subsets of bits in the puncture groups and the multiple combinations of subsets are described below in connection with FIGS. 4A through 4G.

As shown in FIG. 1, the encoded and interleaved bits are demultiplexed via demultiplexer 16 into respective data streams for transmission on respective channels 18 and 20. As described below in connection with FIG. 5, the encoded data can be demultiplexed prior to interleaving. In the illustrative example, the source data stream is subjected to outer FEC encoding (e.g., Reed-Solomon (255,223) encoding and block interleaving) prior to the convolutional encoding and interleaving of the present invention. The encoded and interleaved data streams are provided with synchronization data to allow for synchronization and alignment of the data signals at the receiver prior to multiplexing, de-interleaving and decoding, as indicated at 22, 24 and 26 in FIG. 1 and described below in connection with FIG. 8.

Figure 4A:
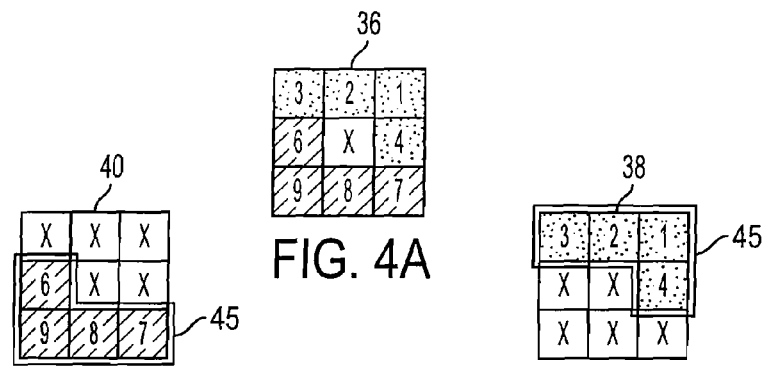
FIGS. 4A, 4B, 4C, 4D, 4E, 4F and 4G depict punctured data groups in accordance with an embodiment of the present invention.
Figure 2:
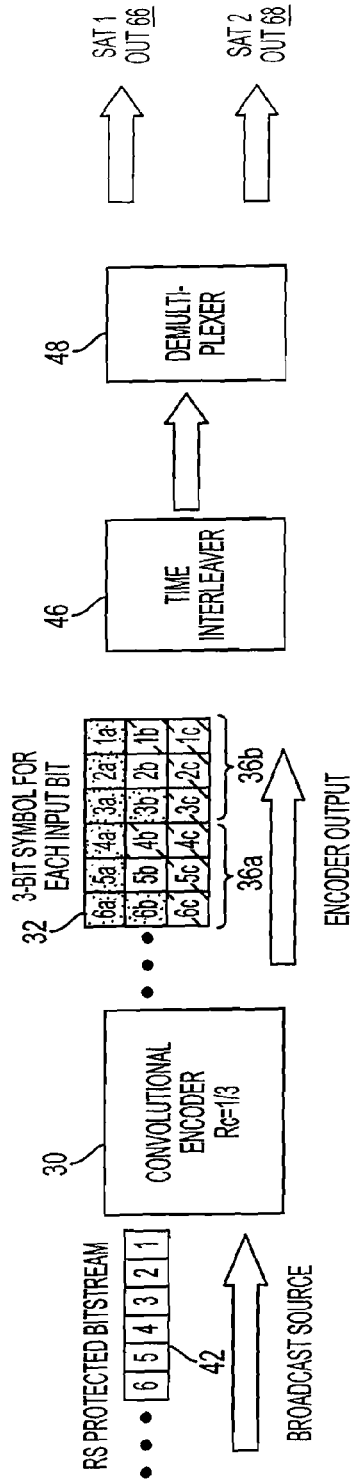
FIG. 2 is a block diagram illustrating an encoding and interleaving device, and the data stream generated by an encoder therein, in accordance with an embodiment of the present invention.
Figure 3:
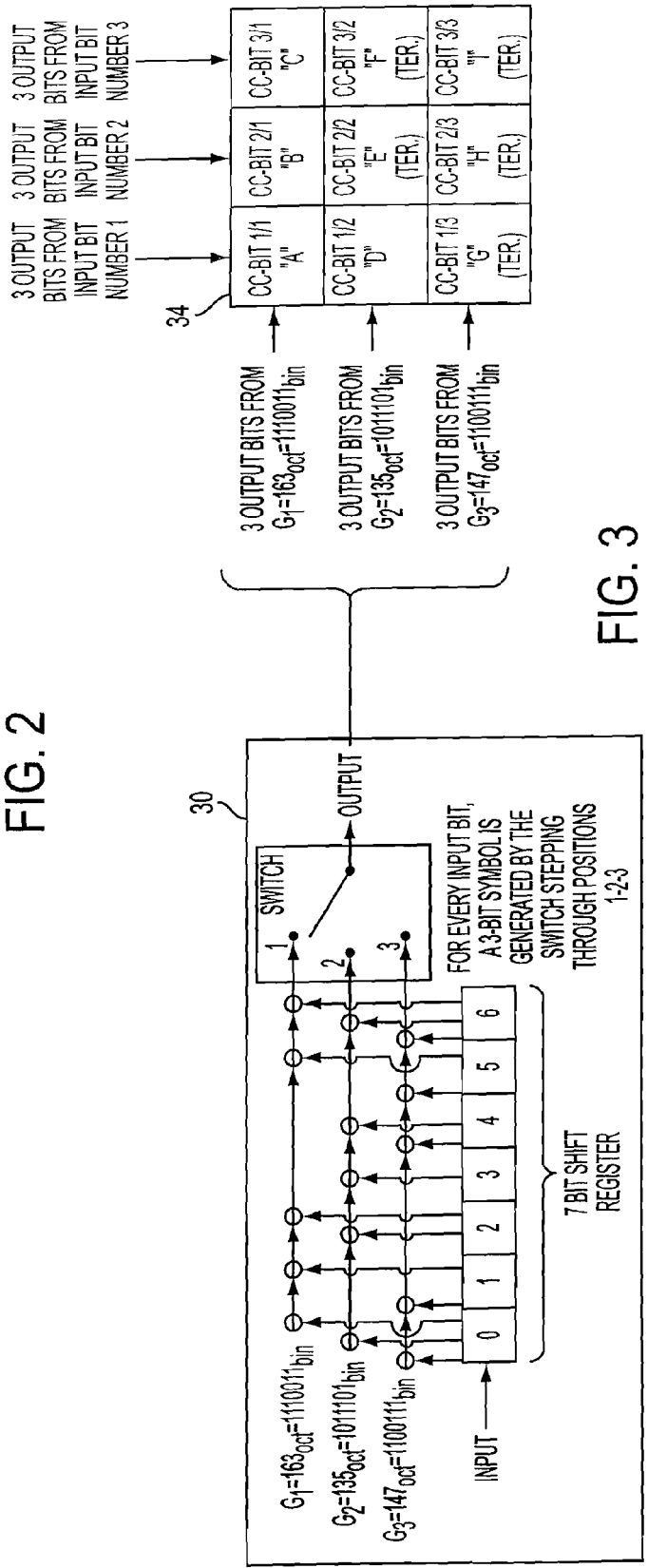
FIG. 3 depicts a convolutional encoder and output data stream in accordance with an embodiment of the present invention.

As shown in FIG. 2, the source bit stream is encoded using a convolutional encoder in accordance with the present invention. As stated previously, the source data stream can be a Reed-Solomon (RS) protected bitstream. The convolutional encoder 30 is preferably a ⅓ rate convolutional encoder with a constraint length of 7. Thus, for every input bit from the source data stream, a 3-bit symbol is generated, as indicated by the encoder output 32. A data group 34 generated by the convolutional encoder 30 is depicted in FIG. 3. In accordance with the present invention, each data group 34 generated by the convolutional encoder is subjected to 1 in 9 puncturing. A punctured data group 36 is depicted in FIG. 4A. The bit positions of the data group are numbered 1 through 9 for illustrative purposes. The fifth bit position is preferably punctured. The remaining eight bit positions are divided between two transmission channels 18 and 20 (e.g., two satellite channels). For example, data in bit positions 1, 2, 3 and 4 are preferably transmitted in one satellite channel 18, and data in bit positions 6, 7, 8 and 9 are preferably transmitted in the other satellite channel 20, as depicted by the satellite-1-only puncture pattern 38 and the satellite-2-only puncture pattern 40 in FIGS. 4B and 4C, respectively. The data group bit positions for a transmission channel are hereinafter referred to generally as channel data groups 45. Thus, the rate for the data stream to be transmitted following convolutional encoding and puncturing is R=⅜. Each of the two transmission channels in the illustrative embodiment, therefore, effectively transmits at a rate R=¾. This is advantageous because the transmitted data stream can still be decoded even when only one of the channels 18 or 20 is available at a receiver.

Figure 4C:
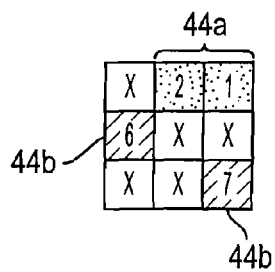
Figure 4B:
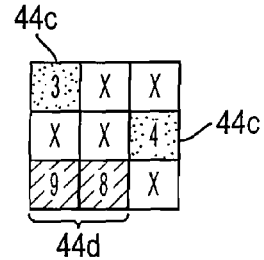
Figure 4D:
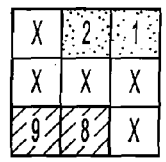
Figure 4E:
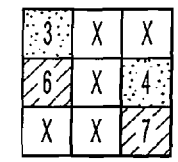
Figure 4F:
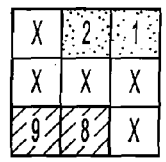
Figure 4G:
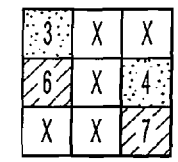

The interleaving operations of the present invention will now be described with continued reference to FIG. 2. Two exemplary punctured data groups 36a and 36b are depicted to illustrate the convolutional encoding of six bits from the source data stream 42. As indicated at 32, three bits are generated for each of the six bits and are numbered 1a, 1b, 1c, 2a, 2b, 2c, . . . , 6a, 6b, 6c. Bits 2b and 5b are punctured in accordance with the 1 in 9 puncturing described previously. In the presence of impaired channel conditions where bits from one or both channels may be lost, the punctured data groups 36 used in accordance with the present invention are advantageous because they present multiple combinations of punctured data bits (hereinafter referred to as subsets of bits 44) which allow for reconstruction of the source data stream from more than one of the transmission channels using a minimum number of the subsets. For example, with reference to FIG. 4D, the source data stream 42 can be reconstructed from the combination of the subset 44a comprising the data in bit positions 1 and 2 of one transmission channel with the subset 44b comprising the data in bit positions 6 and 7 of the other transmission channel. Similarly, with reference to FIG. 4E, the source data stream 42 can be reconstructed from the combination of the subset 44c comprising the data in bit positions 3 and 4 of one transmission channel with the subset 44d comprising the data in bit positions 8 and 9 of the other transmission channel. Other combinations of subsets, as shown in FIGS. 4F and 4G, yield the same results.

As described below in connection with the memory array 92 in FIG. 8, bits from the satellite channels 18 and 20 are aligned and stored into respective memory elements. For example, bits 1 and 6, 2 and 7, 3 and 8, and 4 and 9 from the two channel data groups 45 depicted in FIGS. 4B and 4C are aligned and stored with respect to each other. The combinations shown in FIGS. 4F and 4G illustrate the manner in which the source data stream 42 can be reconstructed from the combination of bits from different memory elements. As shown in FIG. 4F, bits 1 and 2 can be combined with bits 8 and 9 to reconstruct the source data stream. Similarly, bits 3 and 4 can be combined with bits 6 and 7 to reconstruct the source data stream, as shown in FIG. 4G.

Error correction at a receiver is preferably performed using Viterbi decoding. When a QPSK symbol transmitted over a channel is received in error in the illustrated example, a chance exists the both bits are in error following convolutional encoding at a rate R=⅓. To improve the probability that the Viterbi decoder will correct a symbol received in error, the symbol bits are interleaved such that they will be passed through the Viterbi decoder at intervals greater than the constraint length.

In accordance with the present invention, an interleaver 46 (FIG. 2) preferably employs a number of time-interleaving functions to disperse bits in punctured data groups 36, to disperse data groups 34 and to disperse sets of data groups 34, to improve error correction at a receiver. In the illustrated example, the transmitted data stream is time division multiplexed in 432 millisecond (ms) frames. Each frame has 10,880 bits following RS-coding, convolutional encoding and puncturing. As illustrated by block 50 in FIG. 6, the consecutive bits in one of the punctured data groups are shifted by 2720 bits since the punctured data groups 36 each consist of 5440 bits and have two 2720 bit channel data groups 45. The dispersing of the channel data group bits is illustrated at 60 in FIG. 7 for one of the channel data groups 45. Similar, interleaving is performed on the other channel data group 45 in the punctured data group, as well as for both channel data groups 45 in the other punctured data groups 36.

Figure 6:
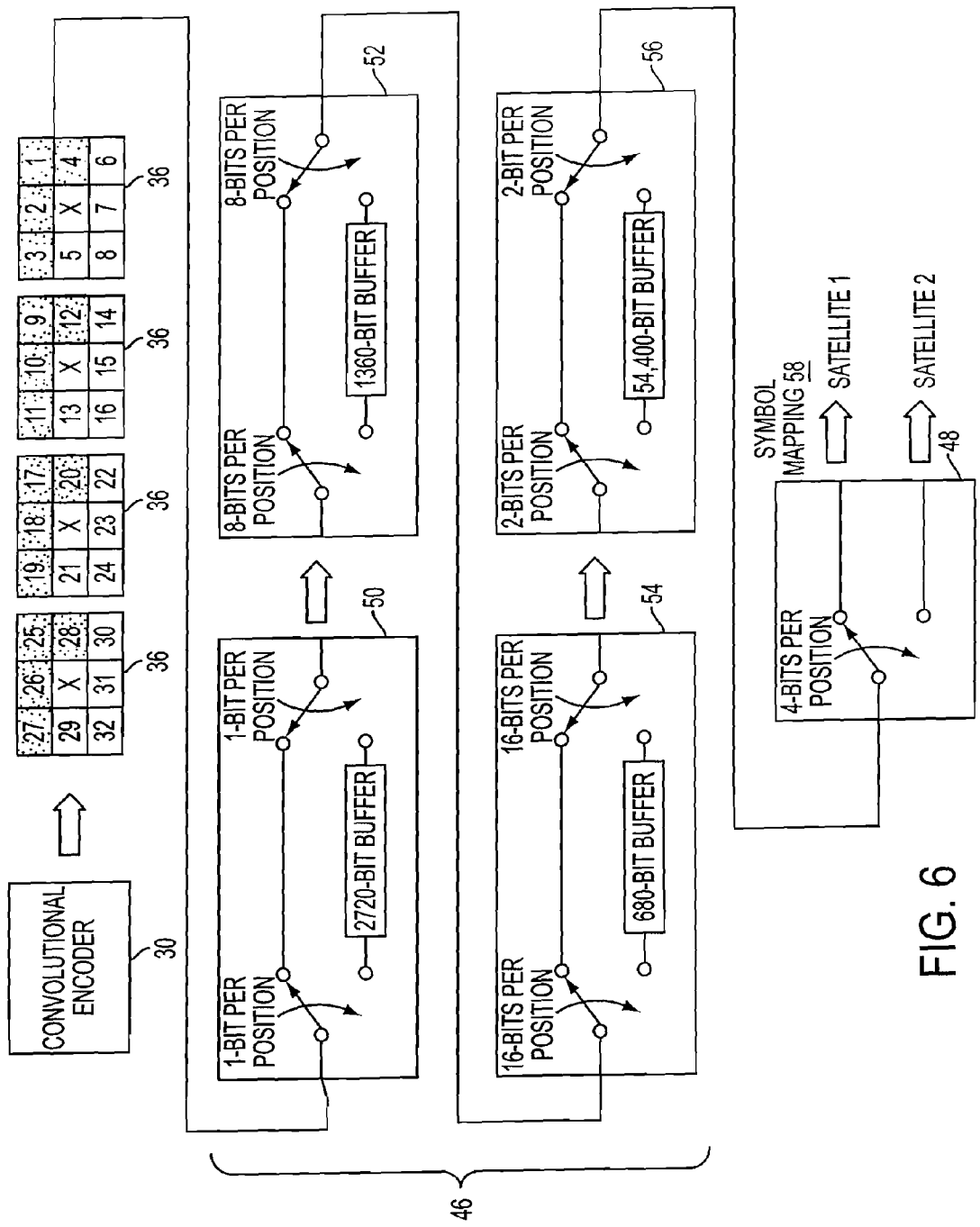
FIG. 6 illustrates time-interleaving functions in accordance with an embodiment of the present invention.
Figure 7:
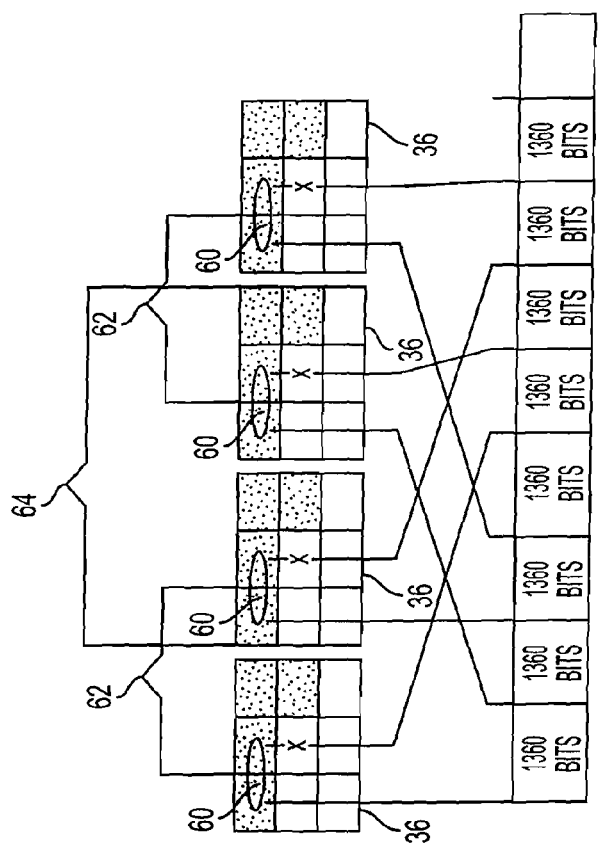
FIG. 7 illustrates exemplary interleaving of sets and subsets of punctured data groups in accordance with an embodiment of the present invention.

With continued reference to FIG. 6, other time-interleaving functions 52, 54 and 56 are employed in accordance with the present invention. For example, the data groups 36 are interleaved with respect to each other, as illustrated by the second function 52 in FIG. 6. The eight bits in each punctured data group 36 are shifted 2*1360 bits or one-fourth of a 10,880 bit frame. Sets of data groups are also interleaved with respect to each other, as illustrated by the third function 54 in FIG. 6. For example, sets of two data groups having 16 bits per set can be interleaved. The sixteen bits in each set of data groups are shifted 2*680 bits or one-eighth of a 10,880 bit frame, as shown in block 54 of FIG. 6 and at 64 in FIG. 7. The first, second and third interleaving functions 50, 52 and 54 operate in a complementary manner to reduce the undesirable effects associated with small-scale fading. In particular, the first, second and third interleaving functions 50, 52 and 54 facilitate the maintenance of only a single bit error within the constraint length of the Viterbi decoder at the receiver for continuous errors that occur in the bit stream due to adverse channel conditions.

Another time-interleaving function is employed, as indicated at 56 in FIG. 6, for large-scale fading. It is to be understood that different models and criteria can be used for bit spreading For example, symbols are dispersed a selected number of frames (e.g., 10 frames or 54,400 bits). It is to be understood that different methods and criteria can be used for bit spreading in the transmitted data stream(s) and that the bit spread can vary (e.g., between frames). The demultiplexer 48 generates two interleaved data streams 66 and 68 from the output of the time interleaver 46. As indicated at 58 in FIG. 6, two-bit symbol mapping can be performed on the two interleaved data streams 66 and 68.

Figure 5:
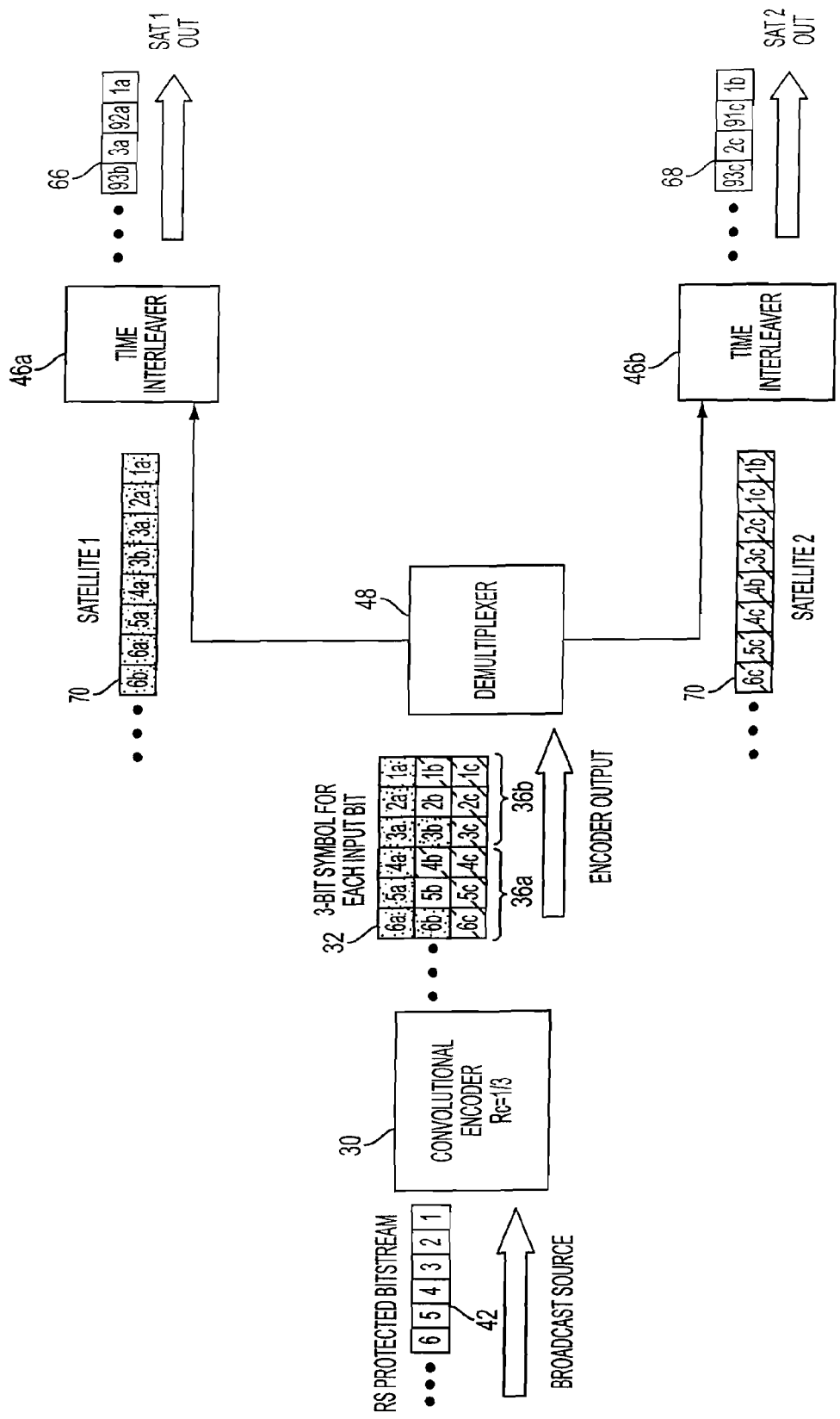
FIG. 5 is a block diagram illustrating an encoding and interleaving device, and the data stream generated by an encoder therein, in accordance with an embodiment of the present invention.

FIG. 5 depicts another exemplary encoding and interleaving device in accordance with the present invention which demultiplexes the output of the convolutional encoder 30 via the demultiplexer 48 prior to interleaving. The two time interleavers 46a and 46b are synchronized with respect to each other.

Figure 8:
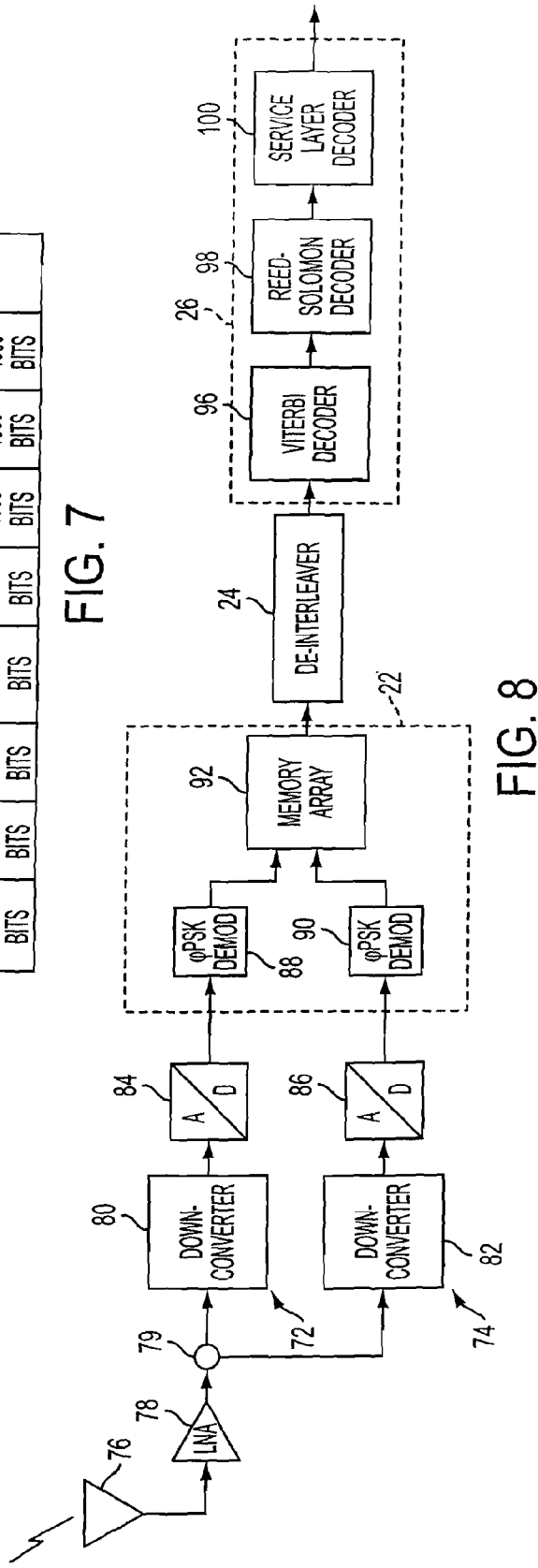
FIG. 8 is a block diagram of a receiver employing decoding and de-interleaving in accordance with an embodiment of the present invention.

With reference to FIG. 8, an exemplary receiver 70 is shown for receiving two or more interleaved signals which are used to transmit same source data. The receiver 70 comprises at least two receiver arms 72 and 74 for receiving signals transmitted on respective transmission channels 18 and 20. In the illustrative embodiment, the channels are from first and second satellites. It is to be understood that if a single frequency channel is used, only one receiver arm is needed. As shown in FIG. 8, a receiver antenna 76 is provided which is preferably sufficiently broadband to receive first and second satellite channels 18 and 20 on different frequencies. A low noise amplifier (LNA) 78 amplifies the satellite signals before the signals are split for further processing by the respective receiver arms. A splitter 79 provides the amplified signal to each receiver arm 72 and 74. One, two or more receiver arms can be used depending on the diversity method used for the communication system.

Each receiver arm 72 and 74 is provided with a downconverter 80 and 82 and an analog-to-digital converter 84 and 86, respectively. A QPSK demodulator and synchronization unit 88 and 90 is also provided in each receiver arm 72 and 74. In accordance with one embodiment of the present invention, the satellite signals are formatted as time division multiplexed (TDM) signals having TDM frames. The TDM frames can comprise multiplexed data from a plurality of sources. In which case, each source data stream is encoded and interleaved as described above, as well as demultiplexed for transmission on plural channels (e.g., via first and second satellites). The TDM frames have preambles in which framing information is provided. For example, a master frame preamble (MFP) and a fast synchronization preamble (FSP) can be provided for synchronization of the TDM frames. A time slot control channel (TSCC) can also be provided in the preamble which comprises information such as a frame counter and data indicating which time slots contain data from which sources. The QPSK demodulator and synchronization unit uses the framing information to synchronize the data stream demodulated from the corresponding satellite channel to facilitate demultiplexing of the TDM frames.

The demodulated data streams from the receiver arms 72 and 74 are applied to multiplexer 22, that is, they are loaded into memory array 92 using the preambles to align the data from each receiver arm. The memory array 92 facilitates combining of the two satellite streams into a single stream for processing by the de-interleaver 24. The multiplexer 22 stores the synchronized data streams received via the receiver arms 72 and 74 in corresponding consecutive registers in first and second portions of the memory array 92. The content of corresponding register pairs in the first and second portions of the memory array are extracted by the de-interleaver 24 and combined into a common R=⅜ bit stream. The recovered data streams are weighted in accordance with a signal quality metric (e.g., the average phase error measured at the QPSK demodulator) and then combined using one or more diversity combining methods.

With continued reference to FIG. 8, the multiplexed data stream generated via the multiplexer 22 and provided to the de-interleaver 24 are de-interleaved in accordance with time-interleaving functions described previously in connection with FIG. 6. The de-interleaved data stream is then decoded via an FEC decoding module 26. The FEC decoding module preferably comprises a Viterbi decoder 96 for convolutional decoding. The data stream can then be subjected to Reed-Solomon decoding and service layer decoding, as indicated at 98 and 100.

As stated previously, service outages can occur in systems which broadcast data, video, audio and other information using radio frequencies. These outages can prevent receivers, and particularly mobile receivers, from receiving the broadcast service altogether, or cause them to receive a signal so degraded that the service is rendered unacceptable. These outages are generally due to physical blockage of transmission paths between the transmitter and receiver (e.g., due to mountainous terrain or long tunnels) and multipath fading and reflection of the transmission path.

It is to be understood that the transmitted data stream can transmitted on separate transmission channels using different diversity techniques. For example, the interleaved data streams can be code division multiplexed using spread spectrum modulation to allow transmission on separate channels using the same frequency. Alternatively, the signals can be transmitted with opposite polarizations (e.g., cross or orthogonal polarizations such as horizontal/vertical linear or left/right circular polarizations) on the separate channels using the same frequency. Two or more transmission channels can be transmitted on different frequencies using any analog or digital modulation (e.g. frequency division multiplexing). Additionally, the demultiplexer 48 can be omitted and the output of the interleaver 46 can be applied to a single channel.

Figure 9:
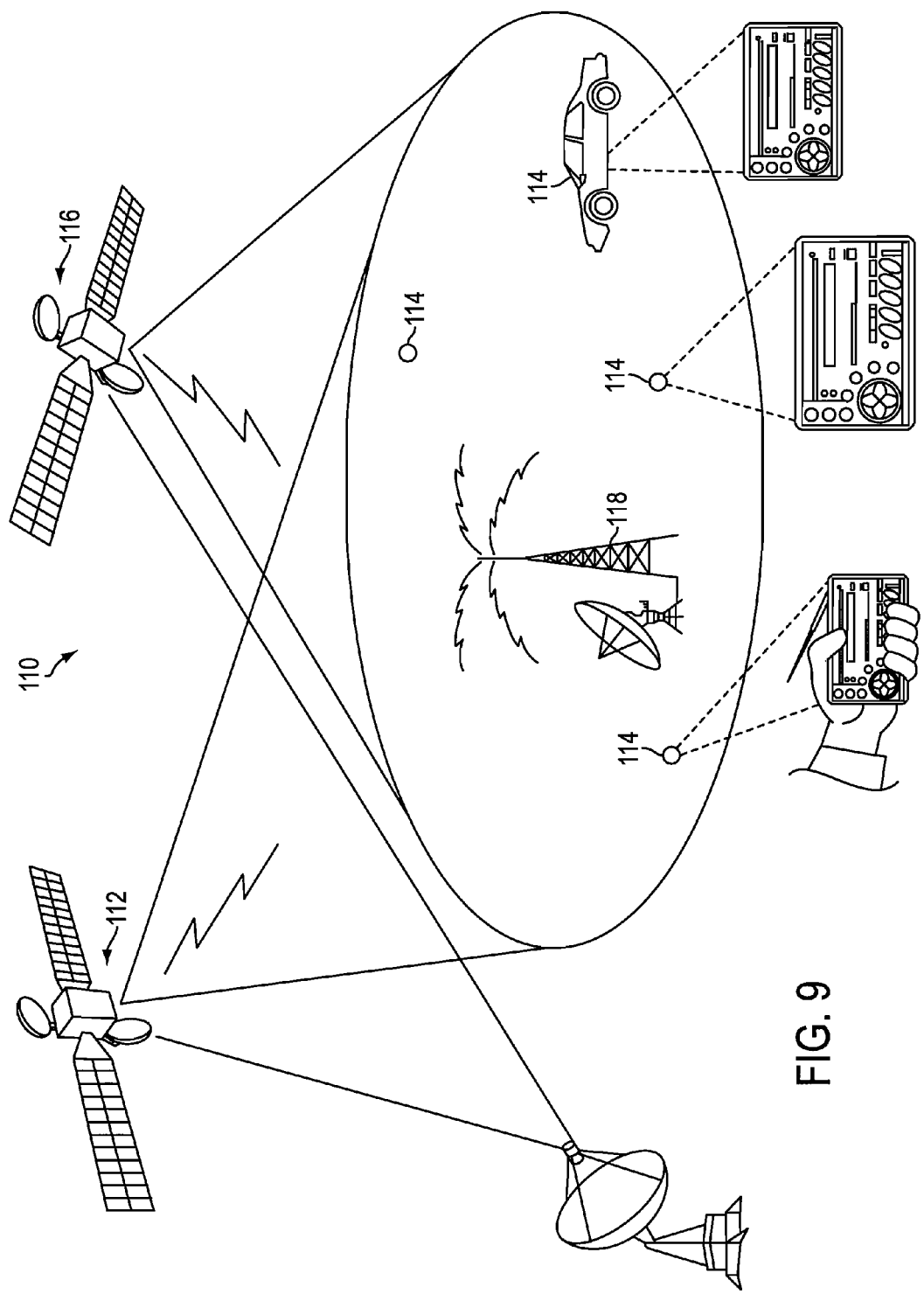
FIG. 9 depicts an exemplary digital broadcast system for transmitting satellite signals and terrestrial signals.

As stated previously, a digital broadcast system can use two or more transmission channels to provide time and/or space diversity for mitigating service outages due to multipath, physical blockages and interference in mobile broadcast receivers. FIG. 9 depicts an exemplary satellite broadcast system 110 employing time diversity which comprises at least one geostationary satellite 112 for line of sight (LOS) satellite signal reception at receivers indicated generally at 114. Another geostationary satellite 116 at a different orbital position is provided for time and/or space diversity purposes. The system 110 further comprises at least one terrestrial repeater 118 for retransmission of satellite signals in geographic areas where LOS reception is obscured by tall buildings, hills and other obstructions. The receivers 114 can be configured for dual-mode operation to receive both satellite signals and terrestrial signals and to combine or select one or both of the signals as the receiver output. However, it will be understood that, where the receivers are in a fixed location, it is sufficient for such receivers to operate by receiving signals from a single source and that is may reduce the cost and complexity of such receivers if they are designed for single mode operation.

The satellite broadcast segment preferably includes the encoding of a broadcast channel into a time division multiplexed (TDM) bit stream. The TDM bit stream is modulated prior to transmission via a satellite uplink antenna. The terrestrial repeater segment comprises a satellite downlink antenna and a receiver/demodulator to obtain a baseband TDM bitstream. The digital baseband signal is applied to a terrestrial waveform modulator, and is then frequency translated to a carrier frequency and amplified prior to transmission.

In accordance with another embodiment of the present invention, a digital broadcast system employs concatenated convolutional encoding and interleaving with a single bit stream. For example, the system 110 can be configured to place all interleaved bits from a source stream on one TDM stream, as opposed to sending one-half of the source stream bits on one transmission channel and the other half of the source stream bits on another transmission channel. The TDM stream can then be sent via satellite, or via a terrestrial transmitter. The terrestrial transmitter is not necessarily a terrestrial repeater 118 since the source stream can originate from the terrestrial transmitter, as opposed to being received via satellite and subjected to baseband processing and frequency translation.

Although the present invention has been described with reference to a preferred embodiment thereof, it will be understood that the invention is not limited to the details thereof. Various modifications and substitutions have been suggested in the foregoing description, and others will occur to those of ordinary skill in the art. All such substitutions are intended to be embraced within the scope of the invention as defined in the appended claims.

What is claimed is:

1. A method of deinterleaving an interleaved data stream transmitted on at least one transmission channel wherein the interleaved stream is received and synchronized, comprising:

deinterleaving the synchronized stream in accordance with time-interleaving functions corresponding to a plurality of time-interleaving functions used on the transmitted interleaved stream, said interleaved data stream comprising bits from a source data stream having been encoded via a selected encoding scheme to generate a plurality of data groups, said interleaved data stream having time division multiplexed frames of selected duration, said data groups being interleaved via at least first and second time-interleaving functions to disperse the bits in each said data group within one of said frames and over a number of said frames, respectively, the first time-interleaving function being at least one of a time-interleaving function for shifting bits in each said data group with respect to other bits in said data group, a time-interleaving function for shifting bits in each said data group with respect to an adjacent data group, and a time-interleaving function for shifting bits in each said data group with respect to selected sets of said data groups to facilitate reconstruction of said source data stream from at least a portion of said interleaved data stream received on at least one of said transmission channels for outage protection when only one of the transmission channels is available, and the second time-interleaving function shifting bits in each said data group over a number of said frames to disperse the bits in said interleaved data stream for outage protection of selected minimum duration when both transmission channels are available following a continuous blockage of said transmission channels.

2. A method as claimed in claim 1, further comprising dividing bits in each of said data groups into a selected number of channel data groups corresponding to respective transmission channels used to transmit the same source data for diversity purposes to provide each of said data groups with multiple combinations of subsets of bits among its channel data groups to minimize the number of the subsets needed from more than one of the transmission channels to reconstruct the source data stream, and said deinterleaving comprising deinterleaving said synchronized stream comprising the respective transmission channels in accordance with said time-interleaving functions.

3. A method as claimed in claim 2, further comprising puncturing each of said data groups to generate a plurality of punctured data groups.

4. A method as claimed in claim 1, further comprising decoding said deinterleaved data stream.

5. A method as claimed in claim 4, wherein said decoding employs a forward error correction decoding scheme to reconstruct the source data stream using the deinterleaved data stream.

6. A method as claimed in claim 5, wherein said selected encoding scheme is convolutional encoding and said forward error correction decoding scheme is convolutional decoding.

7. An apparatus for deinterleaving an interleaved data stream transmitted on at least one transmission channel wherein the interleaved stream is received and synchronized, comprising:

a deinterleaver configured to deinterleave the synchronized stream in accordance with time-interleaving functions corresponding to a plurality of time-interleaving functions used on the transmitted interleaved stream, said interleaved data stream comprising bits from a source data stream having been encoded via a selected encoding scheme to generate a plurality of data groups, said interleaved data stream having time division multiplexed frames of selected duration, said data groups being interleaved via at least first and second time-interleaving functions to disperse the bits in each said data group within one of said frames and over a number of said frames, respectively, the first time-interleaving function being at least one of a time-interleaving function for shifting bits in each said data group with respect to other bits in said data group, a time-interleaving function for shifting bits in each said data group with respect to an adjacent data group, and a time-interleaving function for shifting bits in each said data group with respect to selected sets of said data groups to facilitate reconstruction of said source data stream from at least a portion of said interleaved data stream received on at least one of said transmission channels for outage protection when only one of the transmission channels is available, and the second time-interleaving function shifting bits in each said data group over a number of said frames to disperse the bits in said interleaved data stream for outage protection of selected minimum duration when both transmission channels are available following a continuous blockage of said transmission channels.

8. An apparatus as claimed in claim 7, further comprising a decoder configured to decode said deinterleaved data stream.

9. An apparatus as claimed in claim 8, wherein said decoder is a forward error correction decoder configured to reconstruct the source data stream using the deinterleaved data stream.

* * * * *